United States Patent [19]
Shim et al.

[11] Patent Number: 5,635,042
[45] Date of Patent: Jun. 3, 1997

[54] APPARATUS FOR AUTOMATIC LOADING/ UNLOADING OF RACK CARRYING LEAD FRAME

[75] Inventors: Bo K. Shim; Tae H. Kim; Hwa Y. Lee; Choong H. Han, all of Cheonan, Rep. of Korea

[73] Assignee: Samsung Electronics Co., Ltd., Suwon, Rep. of Korea

[21] Appl. No.: 561,176

[22] Filed: Nov. 20, 1995

[30] Foreign Application Priority Data

Aug. 16, 1995 [KR] Rep. of Korea ............... 1995-25174

[51] Int. Cl.$^6$ ................................. C25D 17/04
[52] U.S. Cl. .................. 204/297 W; 204/297 R; 204/198
[58] Field of Search ............ 204/297 R, 297 W, 204/198

[56] References Cited

U.S. PATENT DOCUMENTS 3,923,631  12/1975  Palisin, Jr. .................. 204/297 R
4,118,301  10/1978  Mayer et al. ................ 204/297 W
4,298,446  11/1981  Ando et al. ................. 204/297 W
4,394,242   7/1983  Clark ......................... 204/297 R
4,851,098   7/1989  Kimura et al. .............. 204/297 R
5,332,487   7/1994  Young, Jr. et al. .......... 204/297 R

*Primary Examiner*—Bruce F. Bell
*Attorney, Agent, or Firm*—Cushman Darby & Cushman IP Group of Pillsbury Madison & Sutro LLP

[57] ABSTRACT

Disclosed herein is a rack for carrying a plurality of lead frames during processes for plating lead frames, which comprises a rack body into which the lead frames are loaded; at least two latch bars which are connected to the rack body and are fixed to/detached from a hoist flight bar to which a plating electrode is electrically connected during plating of lead frames; and an indexing means for positioning the rack as well as positioning an apparatus for transferring the rack, and a plating system using the same.

14 Claims, 5 Drawing Sheets

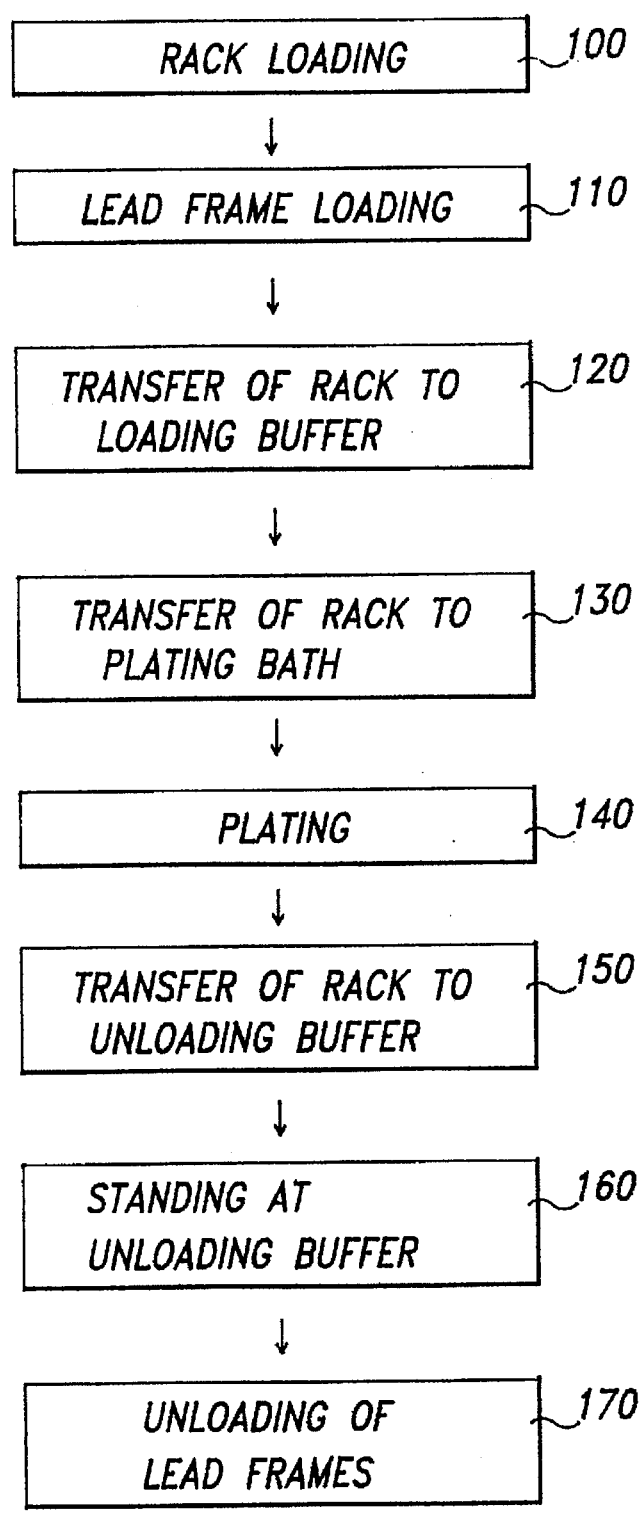

5,635,042

APPARATUS FOR AUTOMATIC LOADING/ UNLOADING OF RACK CARRYING LEAD FRAME

BACKGROUND OF THE INVENTION

1. Field of the Invention

The present invention relates generally to a plating system of semiconductor assembly process, and, more particularly, to a rack for carrying a plurality of lead frames to be plated, which comprises indexing means for aligning said rack and a plating system using the same.

2. Description of the Prior Art

Semiconductor packages are electrically connected to external circuits through the outer leads of a lead frame. The electrical connection between the outer leads and external circuits is generally accomplished by soldering, and the surface of each outer lead made from Fe alloy or Cu alloy should be plated with tin or tin-lead alloy for the purpose of soldering. The surface treatment of outer lead of lead frame is accomplished through a redox reaction between a plating solution and each outer lead, in a plating bath. The surface treatment is usually performed by immersing a rack carrying a plurality of lead frames to be plated into a plating bath of plating machine.

FIGS. 1 and 2 show conventional plating machine. Plating bath (10) contains a plating solution, and a plurality of lead frames (14) to be plated is loaded into the body of a rack (12). Rack (12) is hung to a hoist flight bar (16) of the plating machine and fastened by a bolt. Hoist flight bar (16) serves as a plating electrode. The rack hung to the hoist flight bar is then transferred by a transferrer (18) to the plating bath (10), where the lead frame is plated.

For this apparatus, loading and unloading of rack to and from the hoist bar is performed by bolting and unbolting latch bars (20).

FIG. 2 is a side view of the apparatus of FIG. 1. Rack (12), provided with latch bars (20) each having a groove (21), i.e., a hook-forming slanted notch, is loaded into the plating machine by hanging it by means of the grooves (21) to the hoist flight bar (16) having projecting parts (22), i.e., horizontal pins, and then fastened by a bolt. The loading/ unloading of the rack carrying a plurality of lead frames to/from plating machine was manually carried out. Considering that the weight of rack carrying a plurality of lead frame amounts about 10–13 kg and the loading/unloading of rack should be carried out an average of eight(8) times during 6 minutes, the clamping is very hard work for a worker. Therefore, automation of the loading/unloading of the rack in the plating process of the semiconductor assembly process has been strongly needed.

However, since the conventional rack is coated with epoxy resin except for the latch bars (20), it is difficult to control the dimension of the rack, which is essential for automation. Further, the bars (20) have a high ductility, causing a difficulty in balancing each bar. Further, the hoist flight bar is conductive, because it should serve as a conducting wire for plating lead frames, and consequently automation using electric energy cannot be designed and, therefore, has not been practiced.

SUMMARY OF THE INVENTION

Accordingly, an object of the present invention is to automate the loading/unloading of rack carrying lead frames to be plated in the plating process, so that physical load on workers can be decreased and productivity can be increased.

To accomplish the purpose as described above, the present invention provides a rack for carrying a plurality of lead frames during processes for plating lead frames, which comprises a rack body into which the lead frames are loaded;

at least two latch bars which are connected to the rack body and are detachably fixed to a hoist flight bar to which a plating electrode is electrically connected during plating of lead frames; and an indexing means for positioning the rack as well as positioning an apparatus for transferring the rack.

The present invention further provides a system for plating lead frames, which uses the rack.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 7 is flow chart of the automated plating process according to the present invention.

DETAILED DESCRIPTION OF THE INVENTION

The present invention will now be described in more detail with reference to FIGS. 3–7 of the accompanying drawings.

Figure 1:
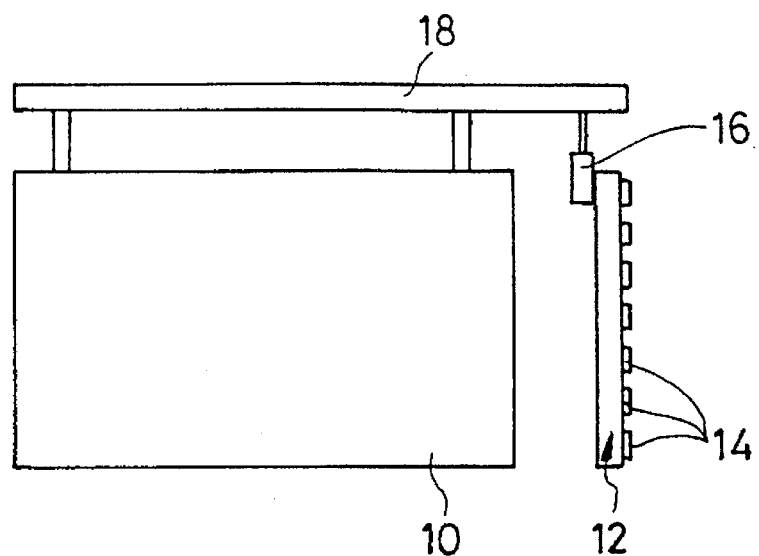
FIG. 1 is a schematic view showing a conventional plating apparatus loaded with a rack carrying lead frames.
Figure 2:
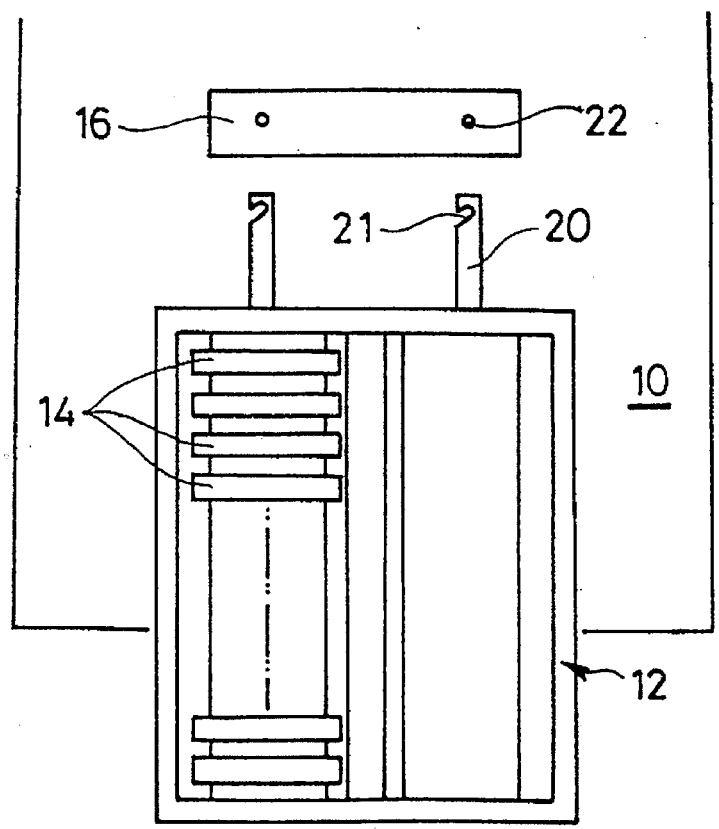
FIG. 2 is a side view of the apparatus of FIG. 1, which shows a conventional hoist flight bar of a plating machine and a rack to be hung thereto.
Figure 3:
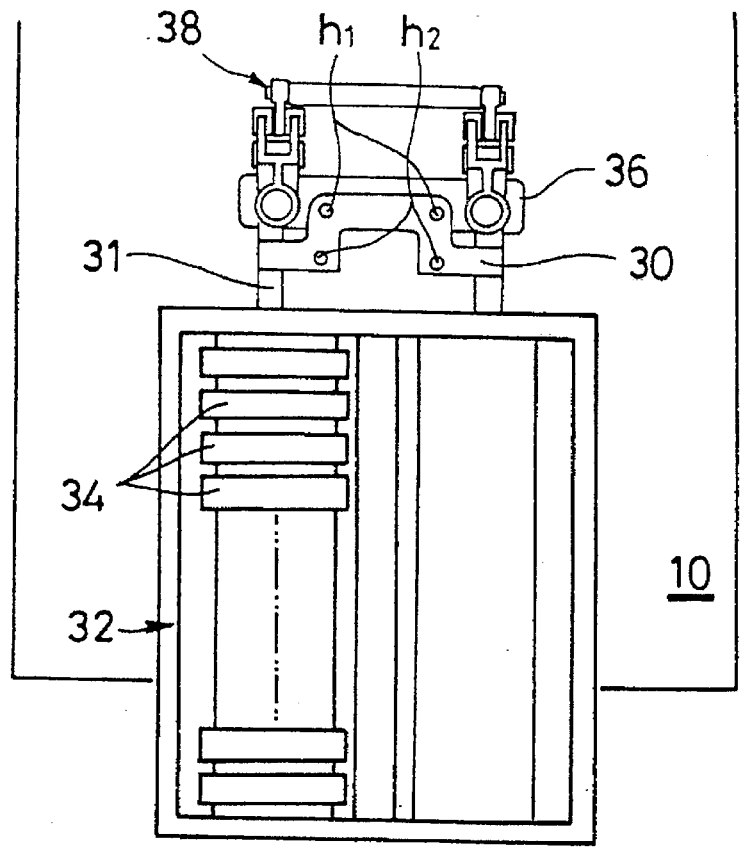
FIG. 3 is a detailed view showing fixation of a rack to conductive hoist flight bar by means of clamper according to the present invention.
Figure 4:
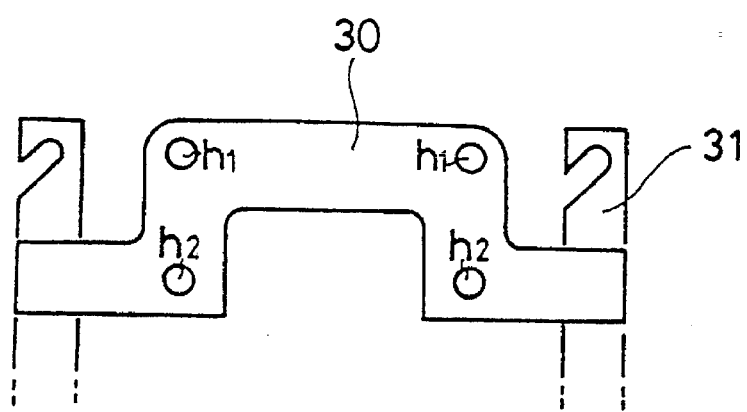
FIG. 4 is a schematic view of rack provided with first and second holes according to the present invention.

FIG. 3 is a detailed view showing fixation of a rack to a conductive hoist flight bar by means of a clamper according to the present invention. The rack according to the present invention, which is designed for the automation of loading/ unloading thereof, comprises first and second holes (h1, h2). These holes (h1, h2) may be formed on a plate (30) which couples the latch bars (31) to the rack. The latch bars (31) are used to hang the rack to a hoist flight bar (36) of the plating machine, as shown in FIGS. 3 and 4.

The first and second holes (h1, h2) are designed as indexes for adjusting the position of rack when the rack is moved along a plating line (or system) or when the rack is fasten to a hoist flight bar (36).

The rack carrying a plurality of lead frames (34) may be hung to hoist flight bar (36) by a loading arm ("loading of a rack"), and then a clamper fastens the rack, as will be described in detail with relation to FIGS. 5A and 5A. Then, the loaded rack (32) is transferred to a plating bath (10), wherein lead frames (34) loaded within rack are plated. After completion of plating, the rack carrying the plated lead frames (34) is moved from the plating bath and the lead frames are removed from the rack.

The conductive hoist flight bar (36) is provided with projecting parts which engage into grooves of the latch bar (31) of the rack are engaged. Each groove has a size such that its diameter is about two times the diameter of the projecting parts, and its depth is less than thickness of the rack, so that accidental detachment of rack can be prevented, even when the clamper (38) fails to function.

As can be seen from FIG. 3, the rack is provided with a plate (30) having holes (h1, h2), which serve as indexes for aligning the rack, as well as for positioning an apparatus for transferring the rack between each line of plating system, so that automation of the loading and unloading of the rack carrying lead frames in the plating process can be accomplished.

FIG. 4 is a partial detailed depiction of the rack, provided with plate (30) having holes (h1, h2). The roles of the holes (h1, h2) will be described in detail hereinafter.

Figure 6A:
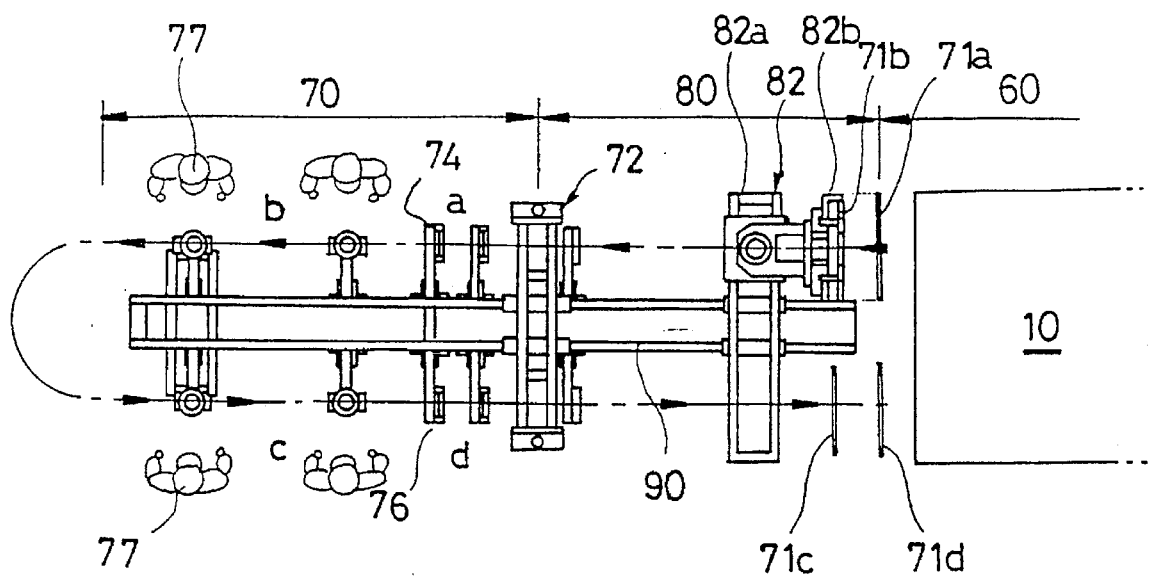
FIGS. 6A and 6B are plan and side views of an automated plating system according to the present invention.

The plating process may be classified into three parts as shown in FIG. 6A: a first line (60) in which lead frames are plated in plating bath (10) ("plating process"); a second line (70) in which lead frames to be plated are loaded into a rack and the plated lead frames are removed from a rack after plating ("loading/unloading of lead frames"); and a third line (80) in which a rack carrying lead frames is clamped to or detached from the plating machine ("loading/unloading of the rack") and is transferred between the first and second lines ("transferring of the rack"). The second line (70) is carried out manually and accordingly its operation is distinguished from the third line, wherein all the steps are automatically carried out according to the invention. Holes (h1, h2) serve as indexes for transferring and loading of the rack in these different lines. That is to say, first holes h1 may serve as an index for loading of the rack by the loading arm in the second and third lines, while second holes h2 may serve as an index for the transfer of the rack in the second and third lines.

Figure 5A:
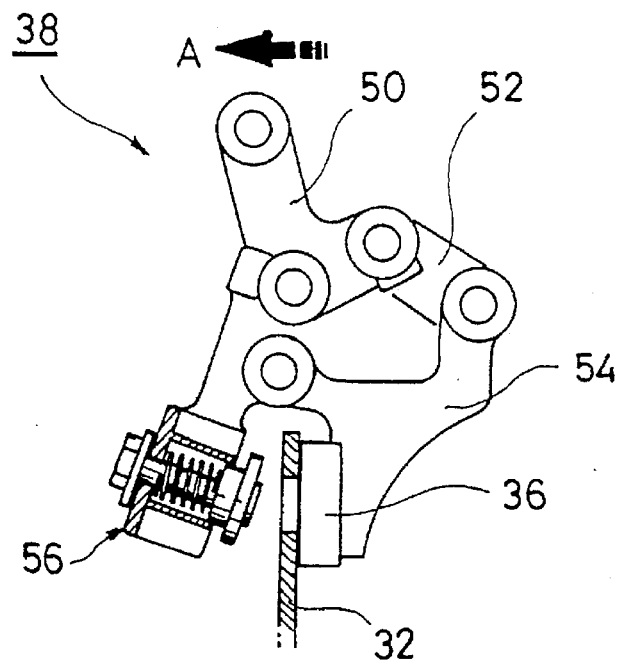
FIGS. 5A and 5B are detailed views showing operation of clamper according to the present invention; 5A shows the detachment of the clamper from the rack, while 5B shows the fixation of the rack to a hoist flight bar.
Figure 5B:
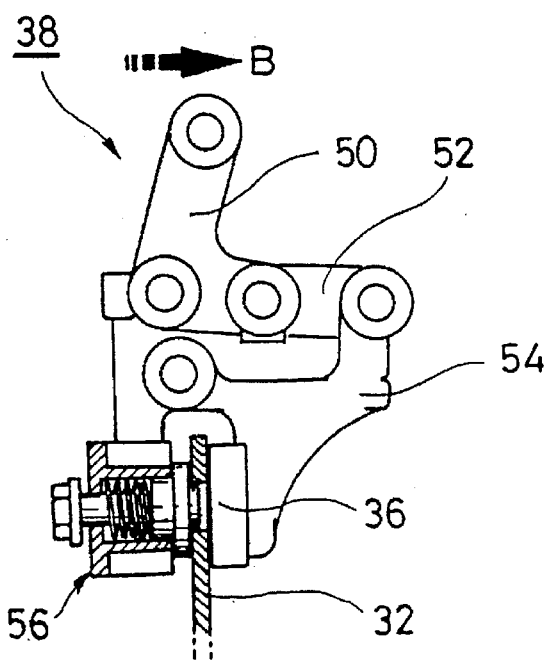

FIGS. 5A and 5B are detailed views of the clamper used for clamping the rack to the conductive hoist flight bar. For the conventional plating system in which loading and unloading of the rack is performed manually, the rack is fixed to the hoist flight bar by means of a fixing means such a as bolt. On the contrary, for the present invention, a unique fixing means is required in order to perform an automated loading and unloading of the rack.

As described above, the conductive hoist flight bar serves as a hanger for the rack as well as functions as an electrode for the plating lead frames loaded within the rack.

FIG. 5A shows an open state, wherein the clamper (38) is detached from the rack (32) in order to transfer the rack (32) after completion of plating of the lead frames, while FIG. 5B shows a fixed state wherein the clamper (38) fixes the rack (32) to the hoist flight bar (36). Clamper (38) consists of an external force part (50), a connecting part (52), a first fixing part (54) fixed to the hoist flight bar, and a second fixing part (56) for fixing (or clamping) the rack to the hoist flight bar. The external force part (50) moves in a reciprocal motion by means of pull/push actions of a loading arm ((82) in FIGS. 6A and 6B) which carries the rack and uses the first holes h1 as an index for positioning the rack.

Because, the first fixing part (54) is fixed to the hoist flight bar and cannot move, the motion of the external force part (50) is transferred to the connecting part (52) and to the second fixing part (56). As the direction of motion of the second fixing part (56) is the same as that of the external force part (50), if a loading arm's force is applied to the external force part (50) in the direction of arrow A as shown in FIG. 5A, the second fixing part (56) is detached from the rack and the rack is detached from the hoist flight bar ("unloading of the rack"). During detachment of the rack from the hoist flight bar, the hole (h2) serves as an index for detecting and aligning the rack. By contrast, if a loading arm's force is applied to the external force part (50) in the direction of arrow B as shown in FIG. 5B, the second fixing part (56) is moved toward and fixes rack to the hoist flight bar ("loading of the rack").

The overall plating system using such a rack and clamper such as have been described above is described in detail hereinafter.

Figure 6B:
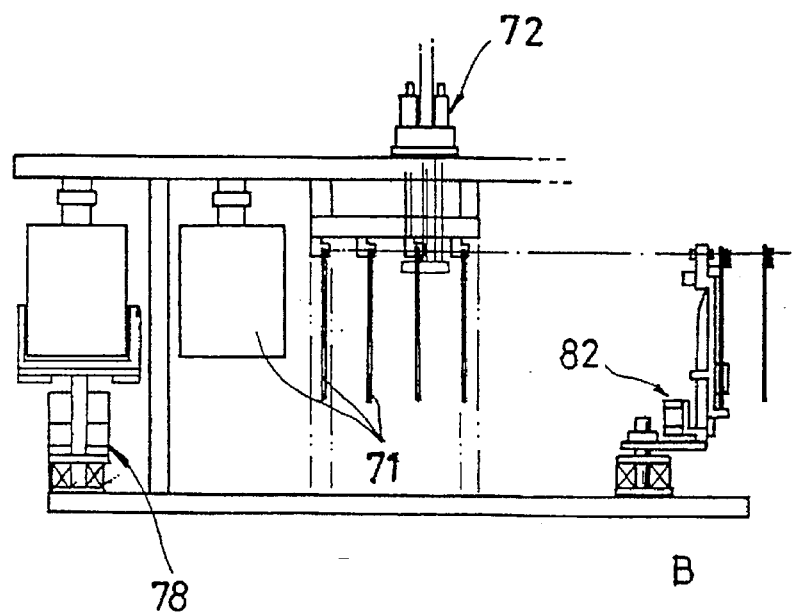

FIGS. 6A and 6B are plan and side views of the system of the loading/unloading of the rack carrying lead frames.

The overall plating process can be divided into three lines: a first line (60) wherein lead frames are plated in the plating bath (10); a second line (70) in which lead frames are loaded into the rack before plating, and unloaded from the rack after plating; and a third line (80) in which the rack is clamped to or detached from the plating machine and is transferred between the first and second lines. In the first line (60), the lead frames are plated by immersing them (while they are loaded within the rack) into the plating bath, in which a redox reaction occurs.

Four of the racks (71a, 71b, 71c, 71d), carrying lead frames plated with tin or tin-lead alloy, are transferred by the loading arm (82) from the line 3 (80) to the line 2 (70). Loading arm (82) pulls the external force part (50 in FIG. 5), which is engaged into the hoist flight bar, to detach the external force part from the rack, and then holds the rack by means of the holes (h2) (shown in FIGS. 3 and 4) and hangs it into the transferring part (72).

Loading arm (82) consists of a fixing part (82a), a transferring part (82b), and a connecting part (not shown), and has a role of moving the racks. The fixing part (82a) can move in a horizontal direction only, while the moving part (82b), which is fixed to the fixing part (82a), can move in a vertical direction and pivot on an axis of the connecting part.

FIG. 6A shows the state in which the loading arm (82) removes a rack (71b) from the hoist flight bar for transferring it to the second line (70). For the transfer of a rack to the second line (70), the fixing part (82a) of loading arm should turn to the left while the moving part (82b) should rotate counterclockwise 180 degrees. After four racks (71a, 71b, 71c, 71d) are transferred to transferring part (72) by means of the loading arm (82), the transferrer (72) hangs racks and transfers them to unloading buffer (74) of the second line (70).

Racks having arrived at "a" in the second line (70) stand ready for being transferred to "b" where the plated lead frames are manually (77) removed from each rack. The speed of transfer of a rack from "a" site to "b" site is controlled by the unloading buffer (74) depending on the speed of removal of lead frames from the rack at "b" site. The plated lead frames may be transferred to the subsequent processes, for example triming and forming process.

Then, the empty rack is moved in the direction indicated by an arrow from "b" to "c", where the rack is loaded with new lead frames to be plated by a worker (77). When the rack should be replaced with new one, the replacement can be automatically accomplished by the rack changer (78) shown in FIG. 6B. The rack loaded with new lead frames at site "c" awaits being transferred to the plating bath through the third line (80). The speed of transferring racks from site "c" to the plating bath is controlled by the loader buffer (76) depending on the speed of plating in the plating bath.

Transferring part (72) aligns racks at the loading buffer (76), and loading arm (82) clamps racks in turn to the hoist flight bar of the plating machine. The fixing of racks at the unloading (74) and loading (76) buffers can be accomplished by using holes h1 shown in FIGS. 3 and 4 as an index for fixing.

FIG. 7 is a flow chart of the plating process according to the present invention. A rack is loaded into the plating system by using the rack changer (78) shown in FIG. 6 (100). The rack is loaded with lead frames to be plated (110). Rack carrying lead frames is transferred by the transferor (72) to the loading buffer and stands there for the subsequent process (120). The rack is moved to the plating bath by means of the loading arm (82) shown in FIG. 6 (130). Then, lead frames are plated in the plating bath (150), and the rack, after completion of plating of lead frames, is moved to the unloading buffer (150). At the unloader buffer, the rack waits and is moved to the subsequent process depending on the operation speed of the subsequent process (160). Thereafter, plated lead frames are removed from the rack for the subsequent assembly process (170).

As described above, the plating system employing racks having the structure according to the present invention can be automated, so that physical loads on workers can be decreased, while productivity can be increased because rapid transfer of racks becomes possible.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed:

1. Apparatus for carrying a plurality of lead frames during processes for plating the lead frames, which comprises:

a rack and a conductive hoist flight bar;

said rack including: a rack body having the lead frames removably loaded there into;

at least two latch bars which are connected to the rack body and are fixed to and detached from a hoist flight bar to which a plating electrode is electrically connected during plating of the lead frames; and an indexing means provided on said rack for positioning the rack and for positioning an apparatus for transferring the rack;

the rack and hoist flight bar being such that the rack is removably hung from the hoist flight bar.

2. The apparatus of claim 1, further comprising:

a plate coupled to the latch bars and provided with a plurality of first holes and a plurality of second holes as said indexing means.

3. The apparatus of claim 2, wherein:

said latch bars each have a groove provided as a slanting, hook-forming slot so that said rack is hung to said hoist flight bar via respective projecting pins on the hoist flight bar.

4. The apparatus of claim 3, wherein:

said projecting pins have a given diameter and each said groove has a width which is about two times the diameter of the diameter of the respective said projecting part, and a depth which is less than the thickness of the rack.

5. The apparatus of claim 1, further including:

a clamper, said clamper comprising a first fixing part fixing the clamper to the conductive hoist flight bar, a second fixing part for selectively clamping the rack to the conductive hoist flight bar, said second fixing part being coupled to one end of the first fixing part, and external force part, which is coupled to another end of the first fixing part and to one end of the second fixing part for linear movement for clamping and releasing the rack relative to the hoist flight bar.

6. The apparatus of claim 5, further including:

a means for transferring the rack, said linear movement of the external force part being performed by said means for transferring the rack.

7. The apparatus of claim 6, wherein:

said second fixing part is arranged to move in a same direction as the external force part for clamping and releasing the rack.

8. A system for plating lead frames, comprising:

(A) an apparatus for loading lead frames, which comprises a rack into which a plurality of lead frames are removably loaded; a conductive hoist flight bar arranged to be removably connected mechanically and electrically to the rack; and a clamper for releasably fixing the rack to the conductive hoist flight bar;

(B) a loading arm for loading and unloading the rack carrying lead frames to and from the clamper;

(C) a line for loading lead frames to be plated into the rack and for unloading plated lead frames from the rack;

(D) an unloading buffer for transferring the racks carrying plated lead frames from the loading arm to the line (C); and (E) a loading buffer for transferring the racks carrying lead frames to be plated from the line (C) to the loading arm.

9. The system of claim 8, wherein:

said rack comprises a plurality of latch bars each having a groove provided as a slanting, hook-forming slot, and a plate having first and second holes and spanning the latch bars, said first holes providing an index for transfer of the rack from the loading arm, loading buffer and unloading buffer, and said second holes providing an index for fixation of the rack in said line.

10. The system of claim 9, wherein:

said loading arm comprises a fixing part, a transferring part and a connecting part connecting the fixing part to said transferring part and having an axis, said fixing part being movable only in a horizontal direction, and said transferring part being movable both in a vertical direction and pivotably about said axis of said connecting part.

11. The system of claim 8, wherein:

said loading arm comprises a fixing part, a transferring part and a connecting part connecting the fixing part to said transferring part and having an axis, said fixing part being movable only in a horizontal direction, and said transferring part being movable both in a vertical direction and in rotary motion about said axis of said connecting part.

12. The system of claim 8, wherein:

said clamper comprises a connecting part, a first fixing part which is fixed to said conductive hoist flight bar, and a second fixing part, which is connected to one end of the first fixing part, for clamping the rack to the conductive hoist flight bar, and an external force part which is connected to another end of the first fixing part and to one end of the second fixing part, to open and close said clamper.

13. The system of claim 12, wherein:

said external force part of clamper is arranged to be driven by said loading arm in one direction to clamp the rack to the hoist flight bar and an opposite direction to detach the rack from the hoist flight bar.

14. The system of claim 8, wherein:

said loading and unloading buffers are arranged to transfer the rack respectively depending on the speed of loading and unloading of lead frames in said line.

* * * * *